(12) United States Patent
Mattison et al.

(10) Patent No.: US 6,366,317 B1
(45) Date of Patent: Apr. 2, 2002

(54) MOTION ESTIMATION USING INTRAPIXEL LOGIC

(75) Inventors: Phillip E. Mattison, Gilbert; Michael J. Fink, Phoenix; Tonia G. Morris, Chandler, all of AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/049,599

(22) Filed: Mar. 27, 1998

(51) Int. Cl.[7] .......................... H04N 5/217; H04N 9/64; H01L 27/148
(52) U.S. Cl. .................. 348/241; 348/243; 250/214
(58) Field of Search ................. 348/390, 392, 348/240, 241, 242, 243; 375/240; 250/208.1, 557, 214; H04N 9/64, 5/217; H01L 27/148

(56) References Cited

U.S. PATENT DOCUMENTS

| | | | | |
|---|---|---|---|---|
| 4,942,473 A | * | 7/1990 | Zeevi et al. | 358/213.26 |
| 5,271,022 A | * | 12/1993 | Herlkamp et al. | 371/37.1 |
| 5,361,326 A | * | 11/1994 | Aparicio, IV et al. | 395/21 |
| 5,644,139 A | * | 7/1997 | Allen et al. | 250/557 |
| 5,962,844 A | * | 10/1999 | Merrill et al. | 250/214 |

* cited by examiner

Primary Examiner—Chris Kelley
Assistant Examiner—Tung T. Vo
(74) Attorney, Agent, or Firm—Steven P. Skabrat

(57) ABSTRACT

An image sensor array for capturing a sequence of video frames has a plurality of pixels, wherein each one of the pixels has a set of intrapixel logic including a previous register to store a pixel value of a previous frame and a current register to store a pixel value of a current frame, the current registers corresponding to the previous registers. An intrapixel subtractor coupled to the previous and current registers produces a difference between the previous and current registers for all pixels in the video frames in parallel. The differences are accumulated for each block of the image sensor array to form a total divergence for each block. The total divergences, associated motion vectors, and pixel values are used in motion estimation processing by a processor coupled to the image sensor array.

27 Claims, 14 Drawing Sheets

PREVIOUS FRAME
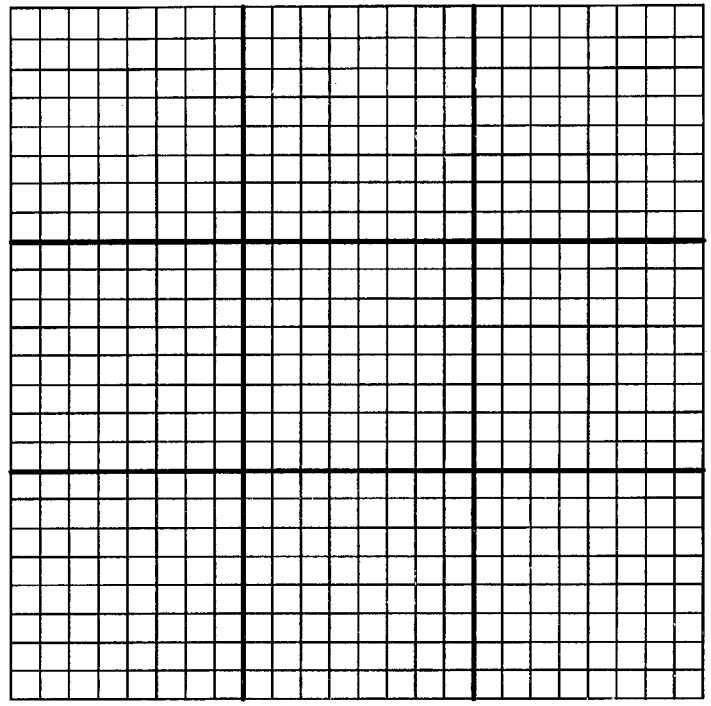
CURRENT FRAME
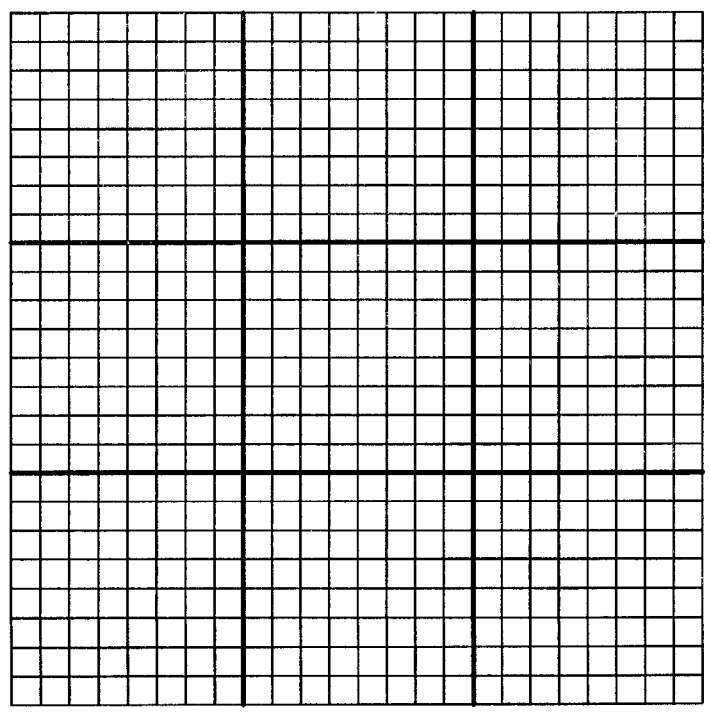
FIG. 4

MOTION ESTIMATION USING INTRAPIXEL LOGIC

BACKGROUND OF THE INVENTION

1. Field of the Invention

The present invention relates generally to video compression algorithms and circuits in digital imaging and video systems and more specifically to circuitry for supporting motion estimation processing for a sequence of video frames.

2. Description of Related Art

Video consists of a series of still images. For still images, the image data tends to have a high degree of spatial redundancy. Capturing the movement of a three dimensional object through time in a video sequence requires an analysis of this spatial redundancy. In a first image of a sequence, a spatial projection of an object is captured in a first region of the first image. Since the projection comprises pixels from the object, correlation within the image is expected. If the object is moving during a sequence of images, it will yield a spatial projection in the next image in a second region. Thus, a high degree of temporal redundancy between neighboring images is also expected. That is, there is a strong correlation between pixels in the first region in the first image and pixels in the second region in the next image. The goal of video compression algorithms is to exploit both the spatial and the temporal redundancy within an image sequence for optimum compression.

Most video coders use a two-stage process to achieve good compression. The first stage uses a method that exploits temporal redundancy between frames. The output of this stage is followed by a coding method that exploits spatial redundancy within each frame. One might expect that an ideal processor for reducing temporal redundancy is one that tracks every pixel from frame to frame. However, this is computationally intensive, and such methods do not provide reliable tracking due to the presence of noise in the frames. Instead of tracking individual pixels from frame to frame, video coding standards provide for tracking of information for pixel regions called macroblocks. Macroblocks are typically 16 pixels by 16 pixels or 8 pixels by 8 pixels in size to provide a good compromise between providing efficient temporal redundancy and requiring moderate computational requirements.

Two contiguous frames in a video sequence can be denoted frame (t−1) and frame (t). In the first stage, frame (t) is segmented into nonoverlapping 16×16 or 8×8 macroblocks and for each macroblock in frame (t), a corresponding macroblock is determined in frame (t−1). Using the corresponding macroblock from frame (t−1), a temporal redundancy reduction processor generates a representation for frame (t), called a difference frame, that contains only the changes between the two frames. If the two frames have a high degree of temporal redundancy, then the difference frame has a large number of pixels that have values near zero. Otherwise, if frame (t) is very different than frame (t−1), then the temporal redundancy reduction processor may fail to find corresponding regions between the two frames.

The output of the first stage is a difference frame in which pixels are spatially correlated. Thus, one can use a processor that can exploit this spatial redundancy and yield a compressed representation for frame (t). Well known video coding standards use discrete cosine transformation (DCT) coding methods for reducing spatial redundancy.

The process of computing changes among successive frames by establishing correspondence between the frames is called temporal prediction with motion compensation. Motion compensation is the process of compensating for the displacement of moving objects from one frame to another. If a temporal redundancy reduction processor employs motion compensation, its output can be expressed as $e(x, y, t)=I(x, y, t)−I(x−u, y−v, t−1)$, where $I(x, y, t)$ are pixel values at spatial location $(x, y)$ in frame $(t)$ and $I(x−u, y−v, t−1)$ are corresponding pixel values at spatial location $(x−u, y−z)$ in frame $(t−1)$. The relative motion of a macroblock from one frame to another is specified by the coordinates $(u, v)$.

Generally, motion compensation is preceded by motion estimation. Motion estimation is the process of finding corresponding pixels among frames. One of the most compute-intensive operations in interframe coding is the motion estimation process. Given a reference picture in a frame and an N pixel by M pixel block in a current picture, the objective of motion estimation is to determine the N pixel by M pixel block in the reference picture that better matches (according to given criterion) the characteristics of the block of the current picture. The current picture is an image or frame at time t. As a reference picture, an image or frame at either past time t−n (for forward estimation), or at future time t+k (for backward estimation), are defined.

The location of a block region is usually given by the $(x, y)$ coordinates of its top-left corner. The coordinates $(x+u, y+v)$ specify the location of the best matching block in the reference picture. The vector from $(x, y)$ to $(x+u, y+v)$ is called the motion vector associated with the block at location $(x, y)$. If the motion vector is expressed in relative coordinates, the motion vector is simply expressed as $(u, v)$.

Various methods for computing $(u, v)$ are known in the art. Typically, these methods have a high computational complexity and are applied to image data stored in memory within a computer system. The motion estimation calculations are done by a processor one operation at a time by extracting pixels of the frames from memory, computing the differences between them, storing the differences back to memory, and using the differences to determine the motion vector. This process can take hundreds of millions of separate operations just to complete motion estimation on one 640 pixel by 480 pixel frame. This computational cost is prohibitive for many operating environments, frame sizes, and frame rates. The high cost of motion estimation is a limitation on the usefulness and availability of full motion video on computer systems. What are needed are methods and circuitry for high speed, massively parallel motion estimation computations which overcome the limitations of the prior art, thereby allowing video compression schemes to drastically reduce the amount of data required to represent full motion digital video and the overall time required for motion estimation processing.

SUMMARY OF THE INVENTION

An embodiment of the present invention is an image sensor array having a plurality of pixels, each one of the plurality of pixels including a first register to store a first pixel value of a first frame, a second register to store a second pixel value of a second frame, the second register corresponding to the first register, and a subtractor coupled to the first and second registers to produce a difference between the first pixel value and the second pixel value.

Another embodiment of the present invention is a pixel of an image sensor array, the image sensor array having a plurality of pixels, each pixel having a first register to store a first pixel value of a first frame, a second register to store a second pixel value of a second frame, the second register corresponding to the first register, and a subtractor coupled to the first and second registers to produce a difference between the first pixel value and the second pixel value.

Another embodiment of the present invention is a method of supporting motion estimation processing in an image sensor array of a video camera. The image sensor array has a plurality of pixels, wherein the plurality of pixels are divided into a plurality of N pixel by M pixel blocks. The steps include capturing a first frame and storing pixel values of the first frame in a plurality of first registers, capturing a second frame and storing pixel values of the second frame in a plurality of second registers, the second registers corresponding to the first registers, subtracting the first registers from the second registers in parallel to produce a plurality of differences, and shifting and accumulating the differences to obtain a total divergence for each block of the image sensor array.

BRIEF DESCRIPTION OF THE DRAWINGS

The features and advantages of the present invention will become apparent from the following detailed description of the present invention in which:

FIG. 4 is a diagram illustrating the previous and current frames divided into multiple 8×8 blocks;

DETAILED DESCRIPTION OF THE INVENTION

Figure 1:
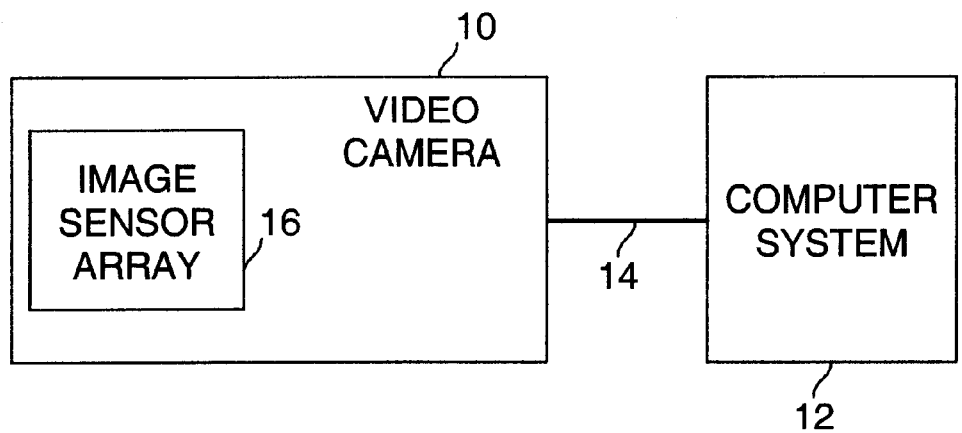
FIG. 1 is a block diagram of the system environment of the present invention.

In the following description, various aspects of the present invention will be described. However, it will be apparent to those skilled in the art that the present invention may be practiced with only some or all aspects of the present invention. For purposes of explanation, specific numbers, systems and configurations are set forth in order to provide a thorough understanding of the present invention. However, it will also be apparent to one skilled in the art that the present invention may be practiced without the specific details. In other instances, well known features are omitted or simplified in order not to obscure the present invention.

In one embodiment, the present invention operates as follows. The photocells of an image sensor array capture an image in a frame, which is converted into a digital format and forwarded into registers associated with each photocell. These registers are connected in a two-dimensional network to allow shifting of values left, right, up or down. A new image is then captured by the image sensor array, so the device now stores two separate images. Every register in the first image corresponds to a register in the second image. Each register pair has an associated digital comparator (subtractor). The output of the comparator is the absolute difference of the current pixel and the stored pixel. All of the outputs of the comparators for a N pixel by M pixel block are transferred to an accumulator (where N and M are arbitrary sizes and in some embodiments N is equal to M). Hence, the absolute value of the difference for each block can be calculated simultaneously for every block in the captured image. The result can then be transferred by the same bus used to transmit the captured image. There is one result for each N×M block. The image stored in the registers is then shifted by one pixel and the comparison process repeated, with the results transferred to a computer system for further motion estimation processing. When a sufficient number of comparisons are made, the computer system analyzes the data to determine which blocks have moved, how far, and in what direction relative to the previous image frame.

More specifically, an embodiment of the present invention is an apparatus wherein the output from an individual pixel of a current frame captured by an image sensor array is converted to a digital signal and stored in an intrapixel register. The value in the intrapixel register of the current frame is compared with the pixel value from the previously stored frame (which is stored in a second intrapixel register) in groups of N×M blocks. In one embodiment, the comparison value is stored in a register and subsequently shifted out into accumulators to tally N such values. The N accumulator values are summed into a final register that represents how well the N×M block in the current frame matched the N×M block in the previous frame. The final register value is used for motion estimation calculations by a processor. All logic and registers reside within the image sensor array for high speed operation. Furthermore, difference computations for all pixels within two successive frames are processed simultaneously in parallel.

Figure 2:
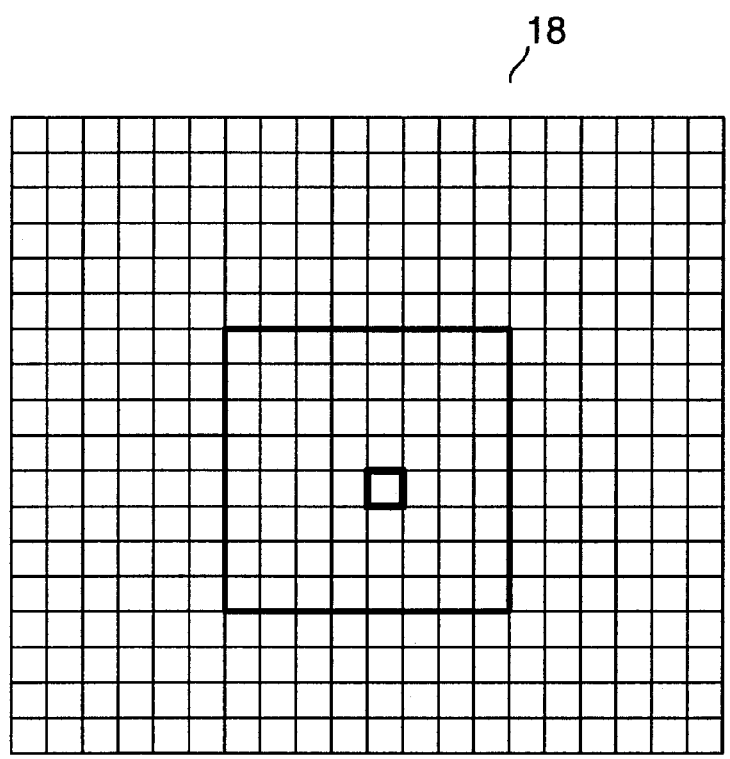
FIG. 2 is a diagram of the logical components of an image sensor array.

FIG. 1 is a block diagram of the system environment of the present invention. A video camera 10 is coupled to a computer system 12 by a communications channel 14. The video camera is a digital video camera having internal digital video capture hardware that translates the captured image into digital graphical data. As part of the internal digital video capture hardware, the video camera includes an image sensor array 16 for acquiring an image. In one embodiment, the image sensor array is a complementary metal oxide semiconductor (CMOS) image sensor. The communications channel is a bus, such as an Institute of Electrical and Electronics Engineers (IEEE) 1394 bus, universal serial bus (USB), or other suitable bus. The image sensor array is a grid 18 of individual pixels as shown in FIG. 2. The image sensor array may consist of 640 pixels× 480 pixels, 1280 pixels×1024 pixels, or be of any other suitable size. Each pixel contains a photo-diode cell to acquire light representing a portion of a scene. The image sensor array is divided up into blocks, only one of which is shown in FIG. 2. In one embodiment of the present invention, the block is 8 pixels×8 pixels in size. However, other block sizes, such as 16 pixels×16 pixels, can also be used.

Figure 3:
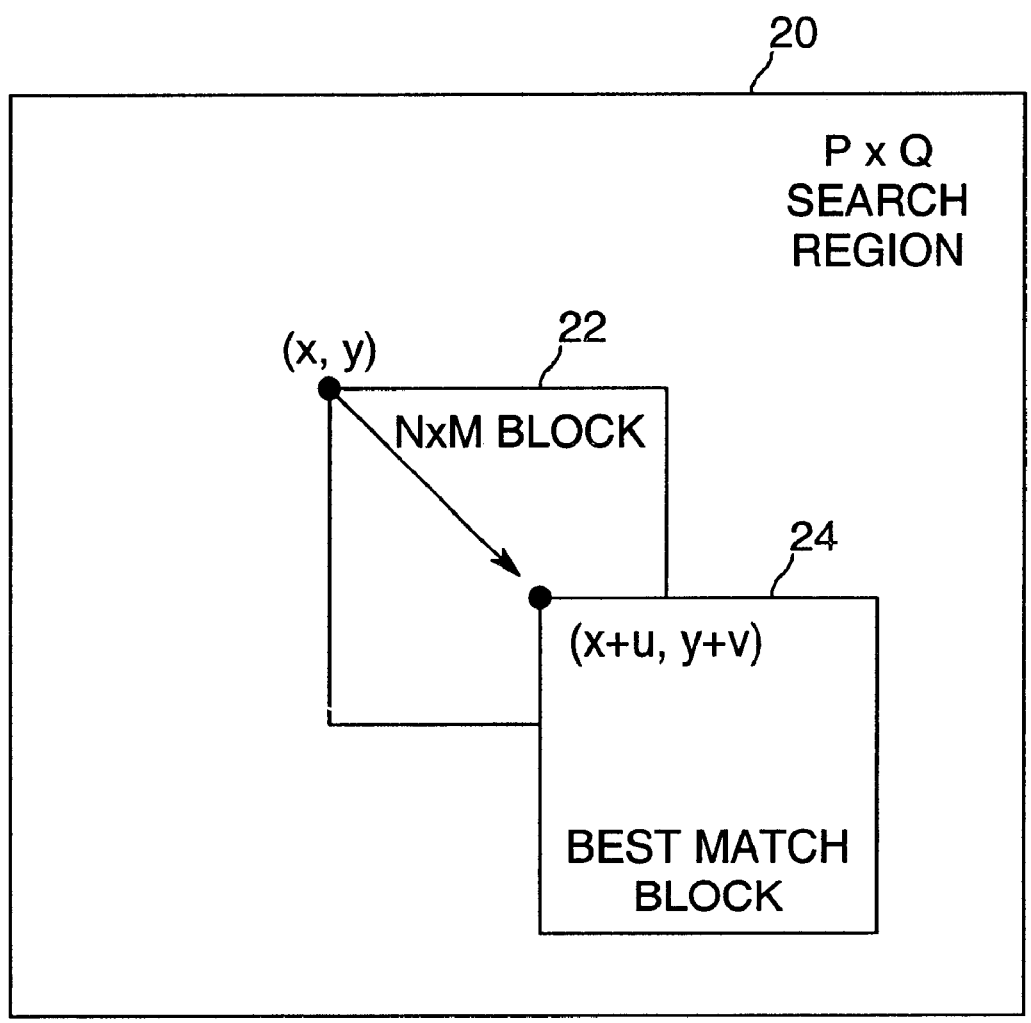
FIG. 3 is a diagram illustrating a motion vector associated with a N×M block and a best matching block.

Motion estimation is a technique used in reducing the amount of data transmitted to represent full motion video. Motion estimation processing determines where a given block in a previous frame moved in a current frame. In an embodiment of the present invention, a N×M block in the current frame is successively compared with N×M blocks in the previous frame to find the best match. The difference between the current block and the best matching block is compressed (typically using DCT methods) and sent across the communications channel 14 along with a motion vector for the block for further motion estimation processing by the computer system. FIG. 3 is a diagram illustrating a motion vector associated with a N×M block and a best matching block. Within a given P×Q search region 20 of the image sensor array, a N×M block 22 is selected and subsequently matched to a best match block 24. The upper left corner of the N×M block is located at coordinates (x, y), and the upper left corner of the best match block is located at coordinates (x+u, y+v). Hence, the motion vector for the current block is (u, v).

Comparing many N×M blocks between two frames is very computationally intensive. Although prior art algorithms and heuristics exist to cut down the number of computations required to find the best motion vector, such methods are not guaranteed to find the absolute best match. However, in one embodiment of the present invention, the best match will be found more quickly than with prior art methods. In this embodiment, full search comparisons between blocks of frames are done by circuitry within the image sensor array.

Figure 5:
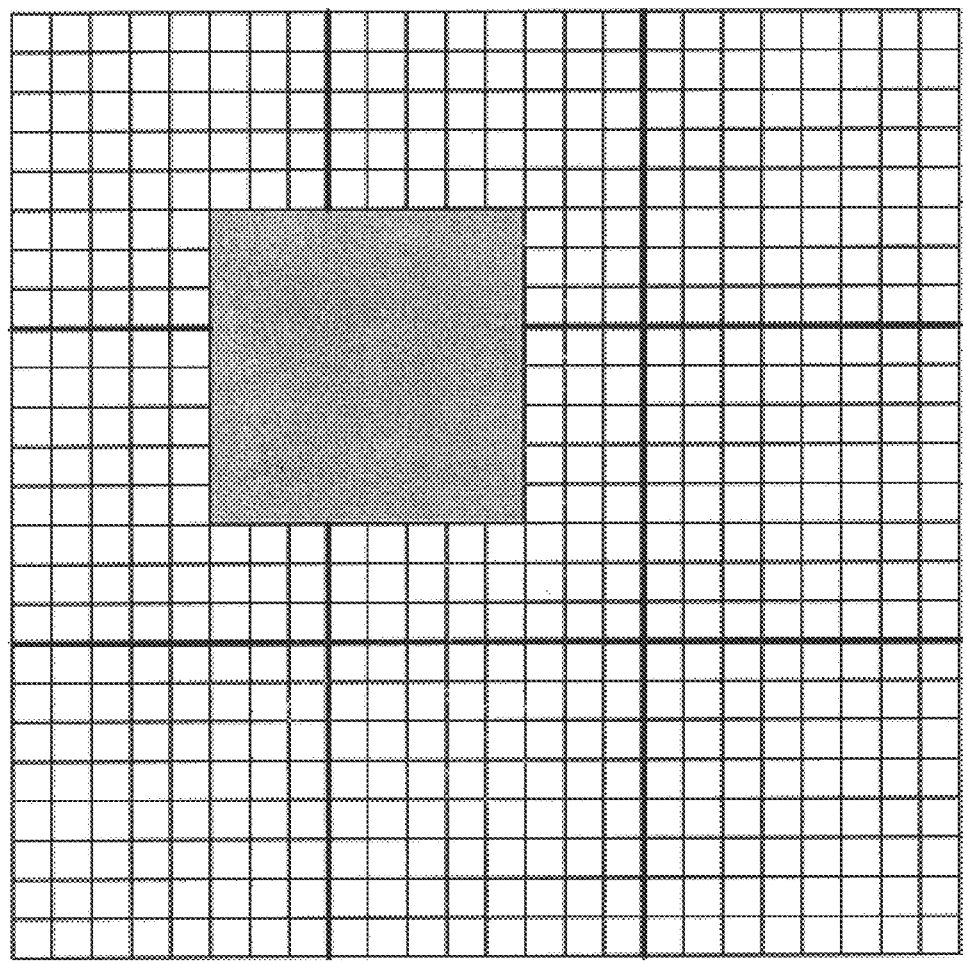
FIG. 5 is a diagram of shifting the previous frame around while keeping the current frame stationary.

Consider two entire image sensor arrays located on the same integrated circuit chip, one that holds the current frame and one that holds the previous frame. Assume the goal of motion estimation processing is to find the best match for a set of 8×8 blocks in the current frame (of course, other size blocks could also be used). The current frame and the previous frame are divided up into 8×8 blocks. FIG. 4 is a diagram illustrating a portion of the previous and current frames divided into multiple 8×8 blocks. In the present invention, the divergence between each of the corresponding 8×8 blocks is computed using intrapixel logic. That is, each pixel contains logic to compute the difference between a pixel in a current frame and a corresponding pixel in a previous frame. This approach gives the first data point of many in a given search area simultaneously for each block. The current frame is fixed while the entire previous frame is shifted. The previous frame is shifted by one pixel in one direction and all of the intrapixel logic is again used to calculate the frame difference. If the total frame divergence of a given 8×8 block is less than the previous, then there is a better correlation between the blocks. FIG. 5 is a diagram illustrating the shifting of a previous frame while keeping the current frame stationary. Only one block (i.e., the shaded block) is shown for the current frame to better demonstrate frame shifting. The entire previous frame is shifted around and the differences are calculated, always keeping track of the blocks that correlate the best to each other. If the new frame shift matches better for a given block, the horizontal and vertical frame shift information and each of the pixel difference values are saved.

Figure 6:
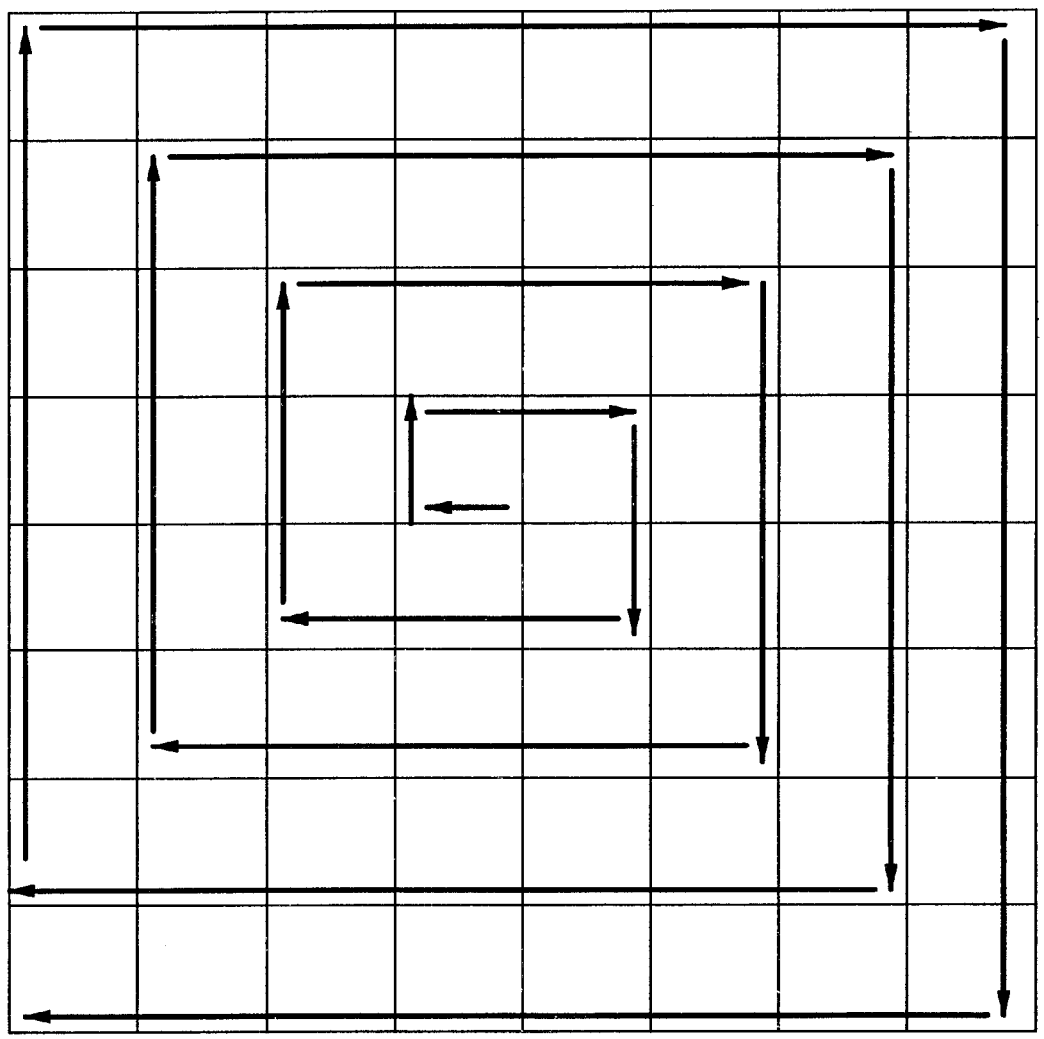
FIG. 6 is a diagram illustrating the spiral shift pattern having only one shift per block difference calculation.

To allow for full coverage of each 8×8 block in a given P×Q search area, in one embodiment a simple spiral pattern is used. In other embodiments, other patterns could also be used. The use of a spiral pattern entails only one frame shift for each massively parallel block divergence calculation. The whole frame is shifted one pixel either up, down, left, or right. In one embodiment, the previous frame is shifted relative to the current frame, although in other embodiments the current frame could be shifted relative to the previous frame. To expand the search area, the spiral is expanded. FIG. 6 is a diagram illustrating the spiral shift pattern having only one shift per block difference calculation. With each shift around the spiral, every N×M block is compared with a different N×M block in the search area. At the end of the spiral, all blocks are compared and all have a best match associated with them. The results of the difference computations are then shifted out of the image sensor array. The results include the motion vectors ((u, v) values) for each block. The results also include the current frame and/or the best match divergence at each pixel. When the spiral shift pattern is complete, the search is done and the best match and coordinates are known for each block in the frame.

Note that spare registers need to reside around the frame perimeter for when the frame shifts beyond the boundaries of the image sensor array. Note also that every shift of the previous frame results in some portion of the frame being out-of-bounds. The perimeter of spare registers must be as wide as the search area requires.

Figure 7:
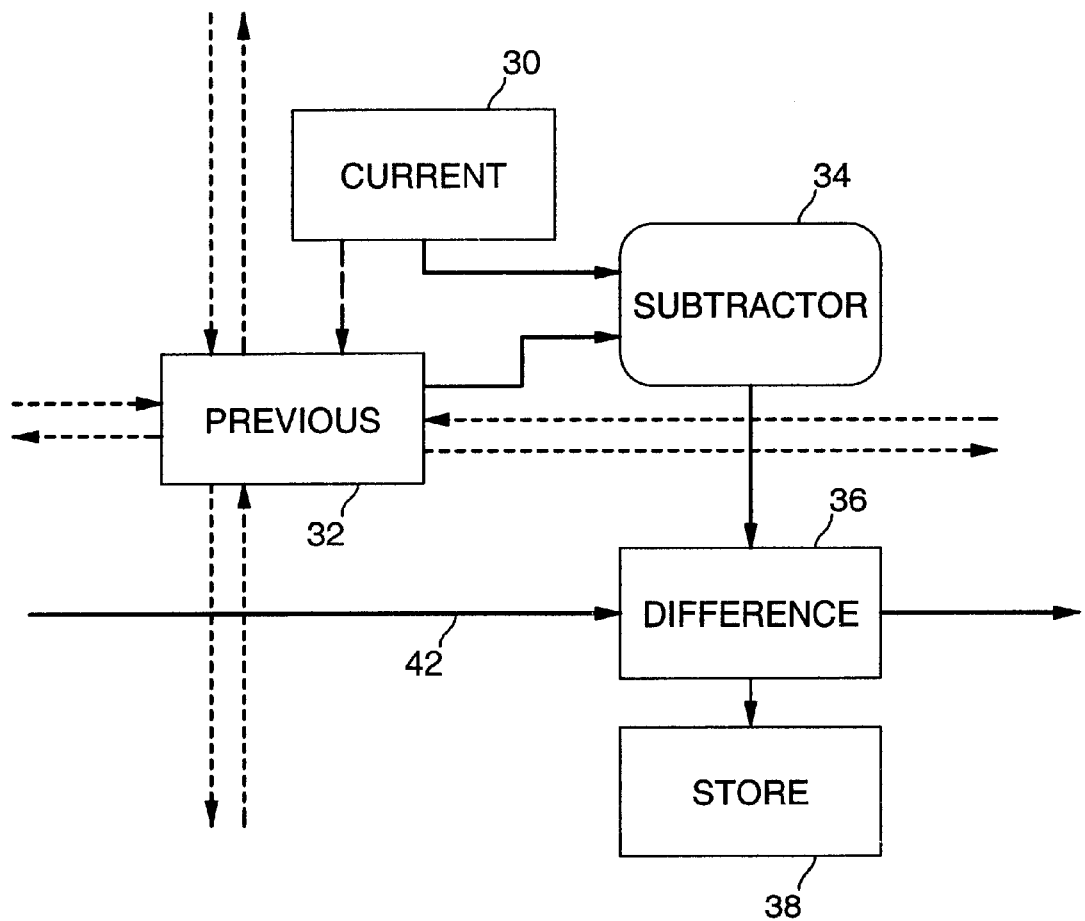
FIG. 7 is a block diagram of the circuitry accompanying each pixel of the image sensor array in an embodiment of the present invention.

In an embodiment of the present invention, each pixel in the image sensor array is accompanied by four registers and a subtractor. FIG. 7 is a block diagram of the circuitry accompanying each pixel of the image sensor array in an embodiment of the present invention. The current register 30 holds the pixel value of the current frame. The previous register 32 holds the pixel value of the previous frame. These two registers feed a subtractor 34 whose output represents the difference between the two pixels. Note that the absolute value of the difference is the important value to be used for motion estimation processing. The output of the subtractor is stored in difference register 36. The difference value is later accumulated with other difference values of an 8×8 block to produce a block difference value. A store register 38 holds the difference value for this pixel when the block difference is found to be a better match than the best match so far.

The previous register 32 is loaded by the current register 30 when it is time to accept another frame. Prior to this loading, the value in the previous register can be shifted out to the previous register in an adjacent pixel in the up, down, left or right directions. The previous register value is shifted instead of the current register value because the spiral pattern finishes with two frames offset. Hence, it is best to discard the frame that is offset to allow easy loading of the current register value into the previous register value on the next frame. The difference register 36 can shift its contents into the next pixel's difference register via line 42. If the pixel is on the right edge of the 8×8 block, the difference register value is shifted into an accumulator (not shown in FIG. 7).

Figure 8:
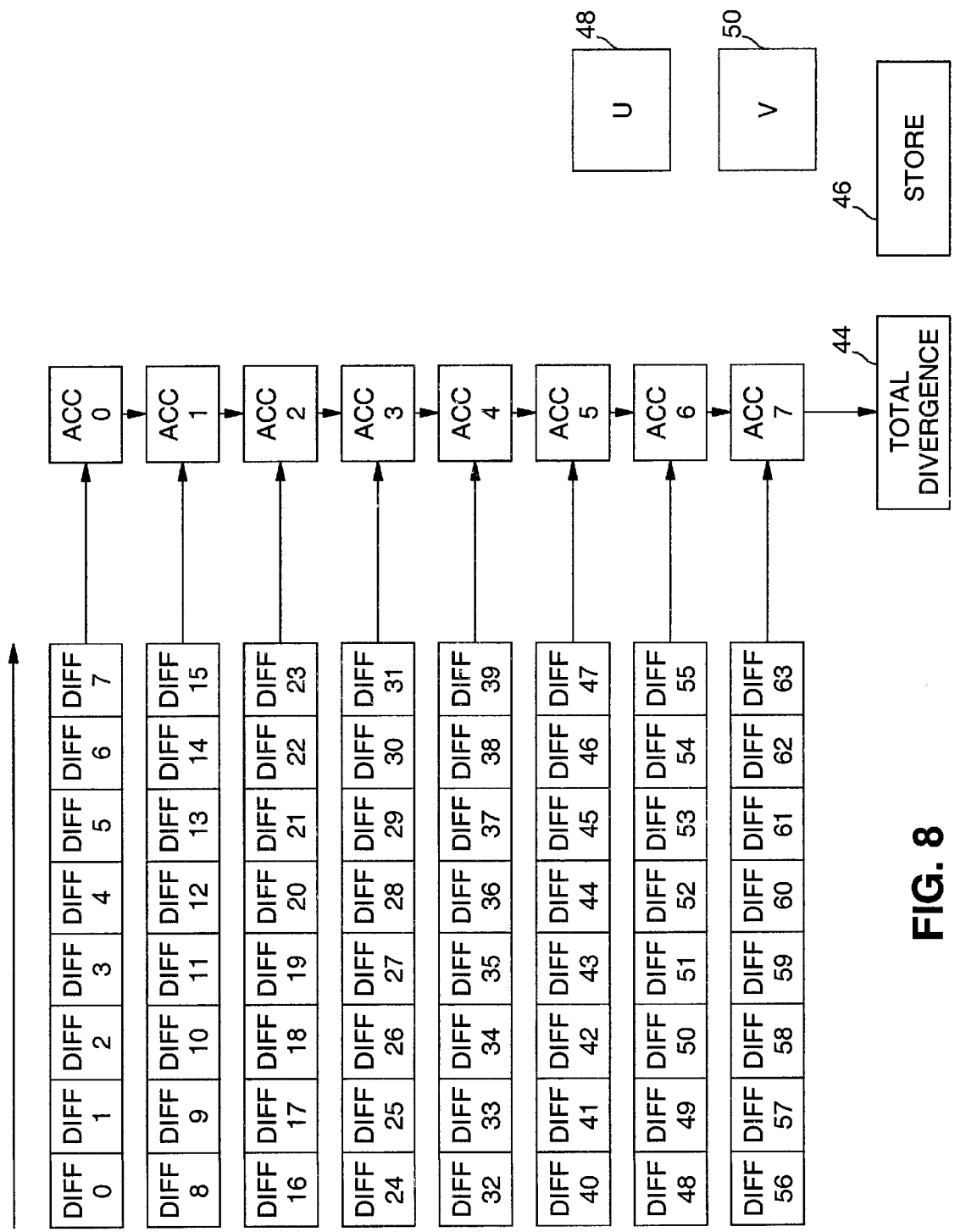
FIG. 8 is a diagram of the difference registers of an 8×8 block and accompanying registers in one embodiment.

FIG. 8 is a diagram of the difference registers of an 8×8 block and accompanying registers. The eight rows of difference values in an 8×8 block are shifted at the same time into a set of accumulators. In this example, each row shifts to the right. For example, the value of difference register 7 (DIFF 7) is shifted into accumulator 0 (ACC 0), the value of difference register 6 (DIFF 6) is shifted into DIFF 7, the value of difference register 5 (DIFF 5) is shifted into DIFF 6, and so on. Hence, the rows are shifted right eight times. When the accumulation across rows is complete, the accumulators shift down into a total divergence register 44. This represents the difference between the previous frame block and the current frame block. For example, the value in accumulator 7 (ACC 7) first shifts into the total divergence register 44, the value in accumulator 6 (ACC 6) shifts into ACC 7, the value in accumulator 5 (ACC 5) shifts into ACC 6, and so on. The goal is to find the block pair with the least amount of variance between frames. The lower the total divergence, the better for motion estimation. Another store register 46 keeps track of the best block-to-block comparison. When the store register 46 saves the better total divergence, the frame offset values (u, v) 48, 50 making up the motion vector are also saved. The frame offset values are obtained from control logic controlling the spiral search pattern.

After the spiral pattern is complete, all of the possible block differences have been calculated and a best case has been saved for each block (i.e., the (u, v) offset and the differences between each individual pixel pair at those (u, v) coordinates have been saved). This information is then shifted out of the image sensor array for further motion estimation processing by the computer system.

There are several state machines associated with the present invention for supporting motion estimation processing. The state machines do not need to be duplicated for each block. The first state machine controls the shifting of the previous frame around the spiral pattern. Use of a spiral pattern is not required, however, the spiral pattern works well because it can allow for the even coverage of the entire search area with single pattern shifts. Alternatively, other shift patterns may also be used. A second state machine controls the shifting of the difference registers into the horizontal accumulators, and then the shifting of those accumulators into the total divergence register 44. It produces signals to properly save the U 48, V 50, total divergence 44, and store registers 46. A third state machine controls the first two state machines and the downloading of all of the data to the computer system for further processing.

Figure 9:
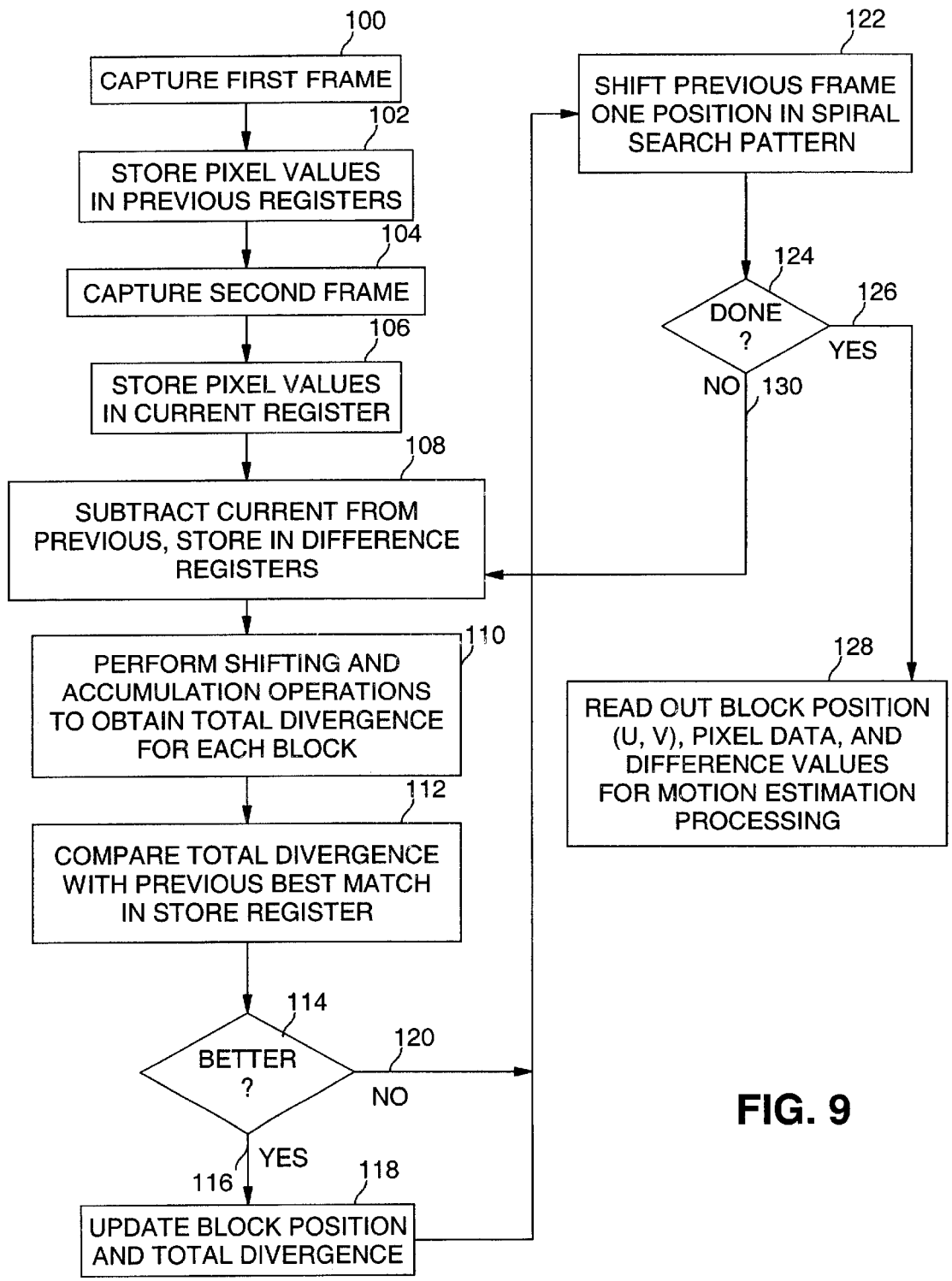
FIG. 9 is a flow diagram of the steps for supporting motion estimation processing according to the present invention.

FIG. 9 is a flow diagram of the steps for supporting motion estimation processing according to the present invention. At step 100, a first frame is captured by the image sensor array at a first point in time. The pixel values of the first frame are stored in a set of previous registers at step 102. A second frame is captured by the image sensor array at step 104 at a second point in time subsequent to the first. The pixel values of the second frame are stored in a set of current registers at step 106. At step 108, the values in the current registers are subtracted from the values in corresponding previous registers and the results are stored in corresponding difference registers. Note that all pixels of the frames are processed in parallel. Next, at step 110, shifting and accumulation operations are performed to obtain a total divergence value for each block of pixels. Processing of all blocks is performed in parallel.

For each block, all blocks being processed in parallel, the total divergence is compared with the previous best match value stored in a store register for each block at step 112. If the new total divergence value is better (according to predetermined criteria) than the stored previous best match value at step 114, then Yes path 116 is taken to step 118. At this step, the block position and best match total divergence values are updated for the block. Otherwise, No path 120 is taken to step 122. In either case, processing continues with step 122, where the previous frame is shifted one position according to the spiral search pattern disclosed in FIG. 6. At step 124, if the end of the spiral search pattern is reached, then Yes path 126 is taken to step 128. At step 128, the block position (U, V), pixel data, and difference values are read out of the corresponding registers and transferred to the computer system for further motion estimation processing. If the end of the spiral search pattern is not reached, No path 130 is taken to step 108. The steps disclosed above are repeated for each pair of successive frames in a sequence of video frames captured by the video camera.

Figure 10:
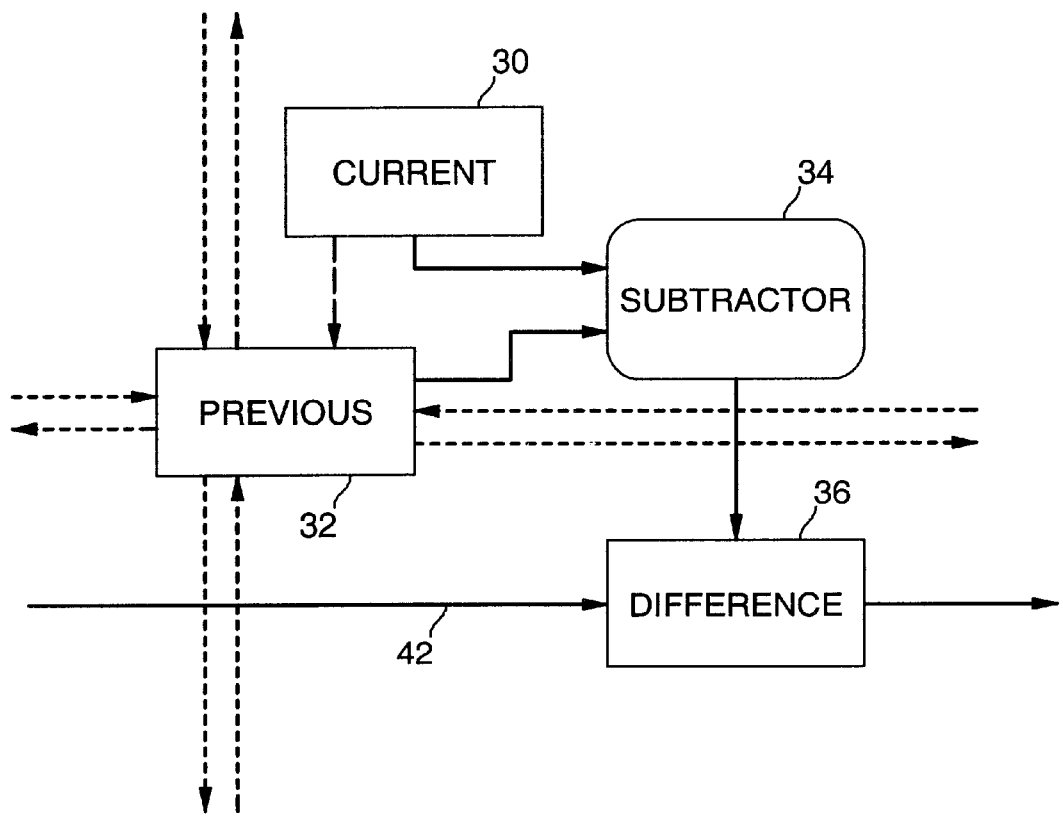
FIG. 10 is a block diagram of the circuitry accompanying each pixel of the image sensor array in another embodiment of the present invention.
Figure 11:
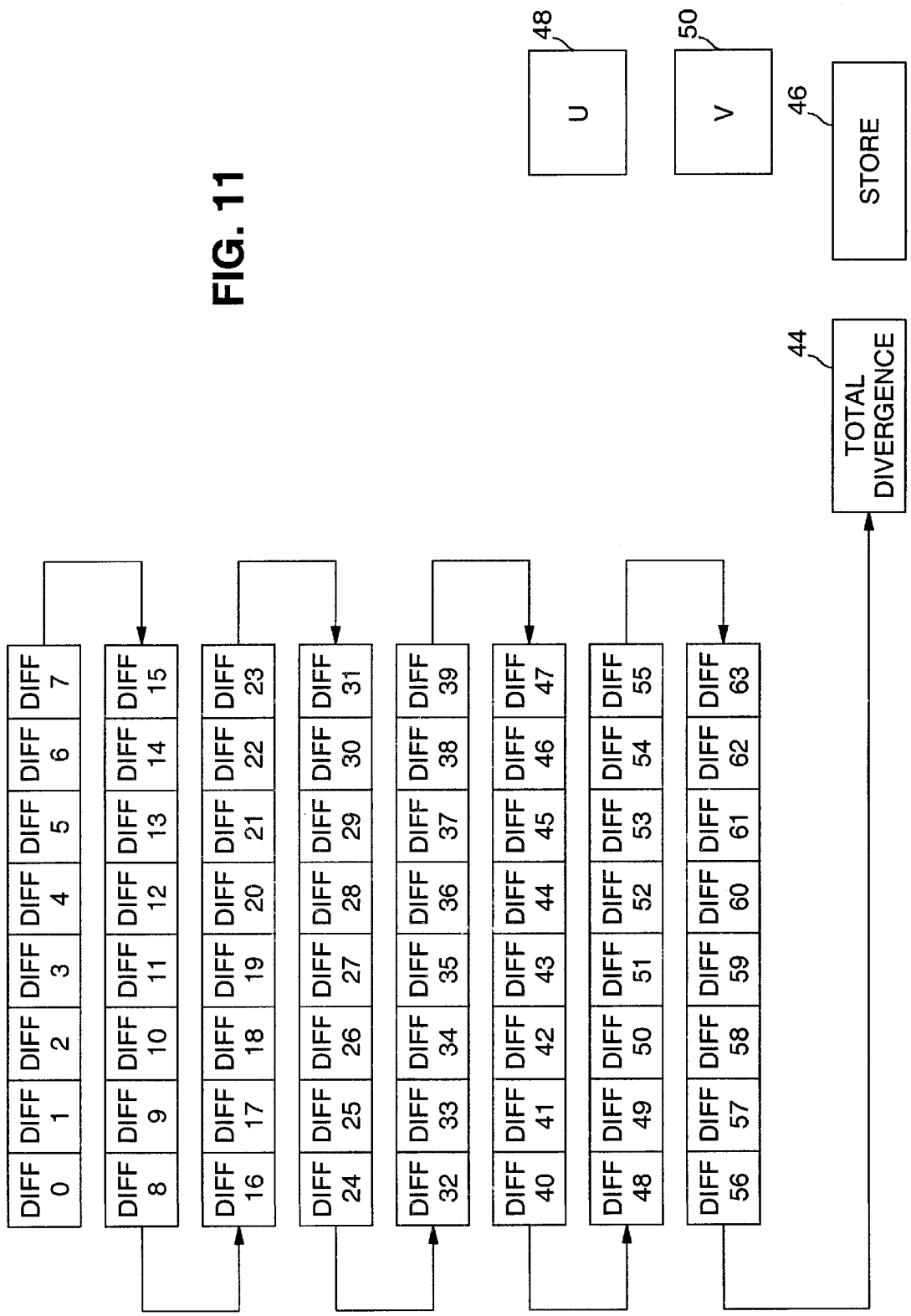
FIG. 11 is a diagram of the difference registers of an 8×8 block and accompanying registers in another embodiment.

In another embodiment, the circuitry of FIG. 7 is optimized to take up less space in the image sensor array logic. FIG. 10 is a block diagram of the circuitry accompanying each pixel of the image sensor array in another embodiment of the present invention. In this embodiment, the store register is eliminated to simplify the intrapixel logic. The lost differences can be recalculated at a small performance cost outside of the image sensor array. Additionally, the horizontal accumulators are removed and all of the difference registers feed each other in a back-and-forth manner, finally getting tallied in a single total divergence register. FIG. 11 is a diagram of the difference registers of an 8×8 block and accompanying registers in this embodiment. A total divergence value can be obtained by 64 shifts of the difference registers.

Figure 12:
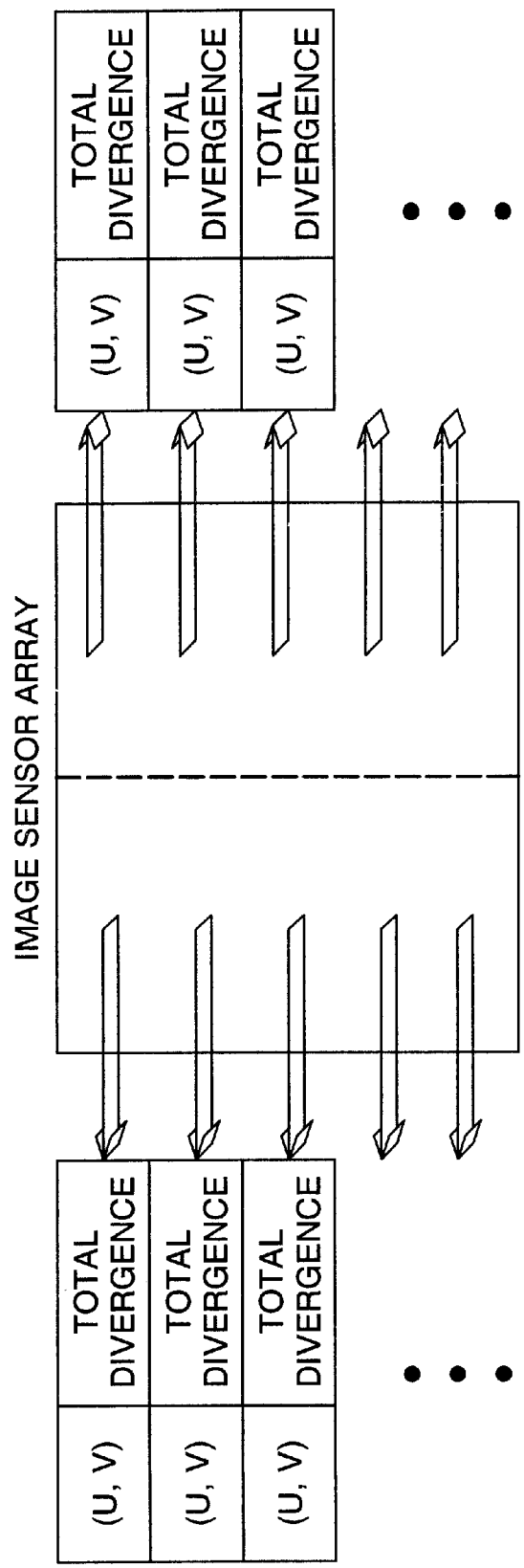
FIG. 12 is a diagram illustrating the routing of the divergence values and motion vectors.

Alternatively, the total divergence registers for each block and the (U, V) motion vector storage registers are moved to the side (edge) of the image sensor array so that they do not interfere with the intrapixel logic. The image sensor array can now consist of a more uniform design. However, the divergence values and motion vectors must now be routed to the outer edges of the image sensor array. FIG. 12 is a diagram illustrating the routing of the divergence values and motion vectors. The total divergence, (U, V), and store registers (not shown) for each block are now located outside of the pixels of the image sensor array. Note that if the image sensor array is 640 pixels wide, then the left half of the image sensor array holds 40 8×8 blocks across and the right half of the image sensor array holds 40 8×8 blocks across.

Figure 13:
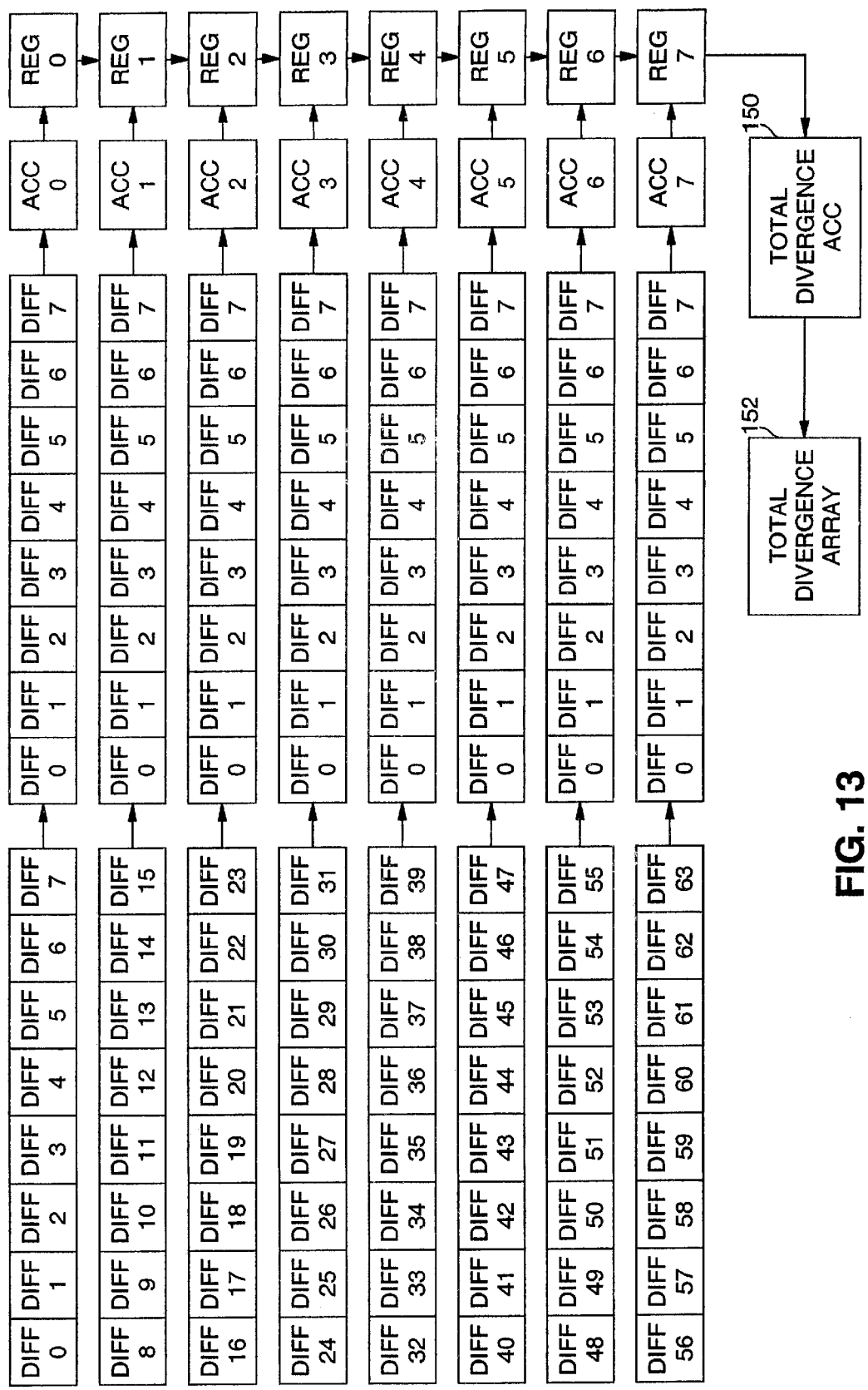
FIG. 13 is a diagram of the arrangement of accumulation hardware located on the edges of the image sensor array.

The concepts of the first two embodiments may be combined to further optimize the design. In this embodiment, all accumulation hardware is located on the left and right edges of the image sensor array and half of an entire row of difference registers is cascaded in parallel to the side of the image sensor array. With each clock cycle, each row is shifted towards the outside of the image sensor array into an accumulator. For the left half of the image sensor array, the rows are shifted to the left to the left edge of the array, and for the right half of the image sensor array, the rows are shifted to the right to the right edge of the array. FIG. 13 is a diagram of the arrangement of accumulation hardware located on the edges of the image sensor array. After a predetermined number of clocks and associated shifts, each accumulator holds the divergence value for a row of a block. This horizontal value is then shifted into a temporary storage register while the accumulator is loaded with the first pixel of the next block. During the clock cycles that the horizontal accumulators are working on a block, the temporary storage registers are shifted down into a single total divergence register 150 for that block. The values for the total divergence registers are further shifted into a storage array 152 for future processing.

In another embodiment, another intrapixel register can be removed in favor of additional routing. The current and previous register values are static between frame shifts, meaning that the output of the subtractor is also constant.

Figure 14:
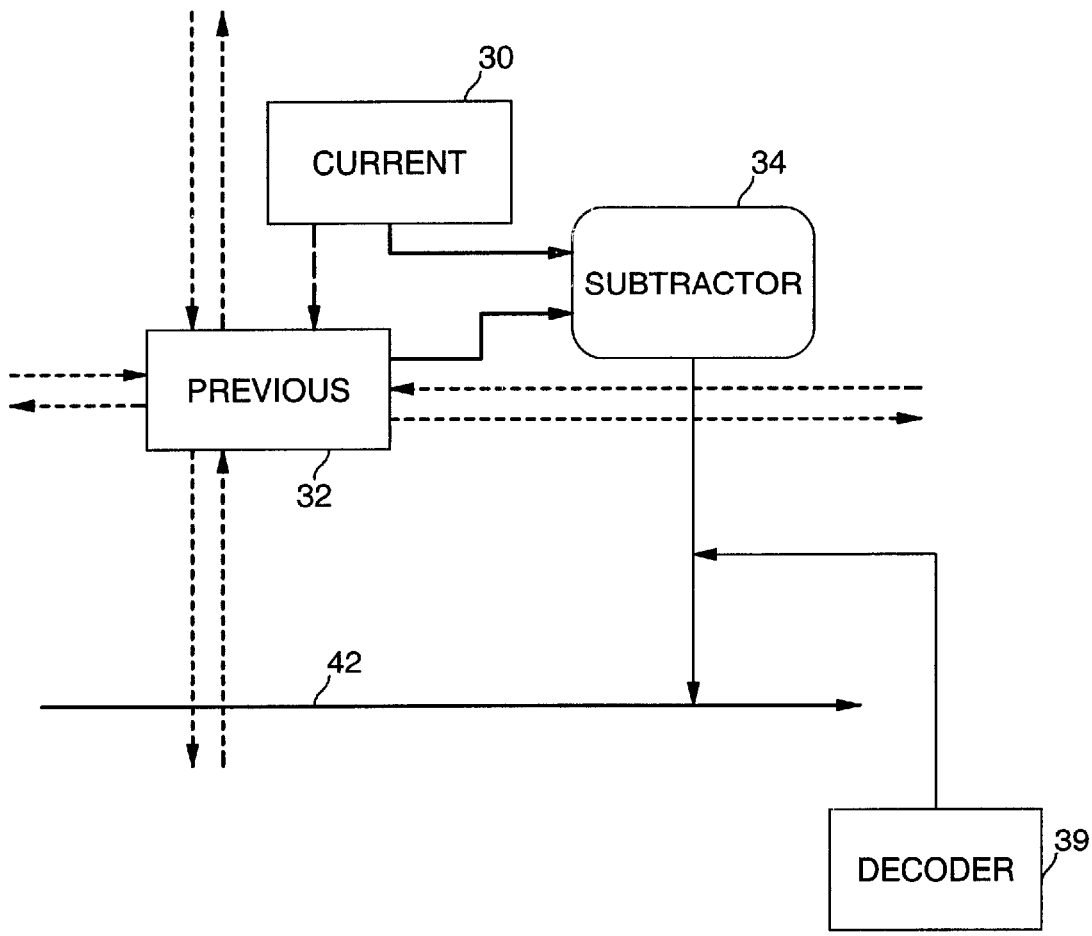
FIG. 14 is a block diagram of the circuitry accompanying each pixel of the image sensor array in another embodiment of the present invention.

Therefore, the difference register can be eliminated if an addressable bus scheme is used in conjunction with the accumulation method described above in FIG. 13. In this embodiment, the frame shifts and the subtractors hold the pixel difference at their outputs. One or more decoders 39 are added to the image sensor array to translate pixel column addresses and decide when to allow difference values onto a simple bus 42 that carries the values to the edges of the image sensor array and into an accumulator. Instead of shifting all pixels all the way across the image sensor array, now a specific pixel is selected by address to shift. The addresses could be generated in order by a counter, for example, to create the same result as prior shifting operations. The block accumulation continues as it did in the previously described embodiment. FIG. 14 is a block diagram of the circuitry accompanying each pixel of the image sensor array in this embodiment of the present invention. In this embodiment, a register is saved in each pixel at the cost of switching circuitry. Parallelism is now required on the new difference bus, and a new set of address lines is needed. A single counter on each edge of the array can serve as the address generator for the difference bus. The details of this implementation are not shown but will be readily apparent to those skilled in the art.

In various embodiments of the present invention, all of the difference values are signed quantities. The total divergence of the block is based on the accumulation of absolute values. The accumulators need to be able to subtract if a negative number is shifted in or a subtractor needs to be able to convert to a positive number. This could also be handled in the intrapixel subtractor to eliminate an extra bit of storage. Values for (U, V) are obtained from global control logic, but the signal to load these values is generated by the total divergence comparison. The total divergence comparison is suppressed when the previous frame shifts beyond its boundaries. This is a special case for those 8×8 blocks that line the edges of the frame.

Shifts out of the difference, previous, U and V registers can be performed serially (i.e., one bit at a time) or in parallel (i.e., all bits shift at once). Difference registers are used to get a good match between blocks. In alternate embodiments, it may be possible to truncate the number of bits in the difference register and still obtain acceptable results.

Figure 15:
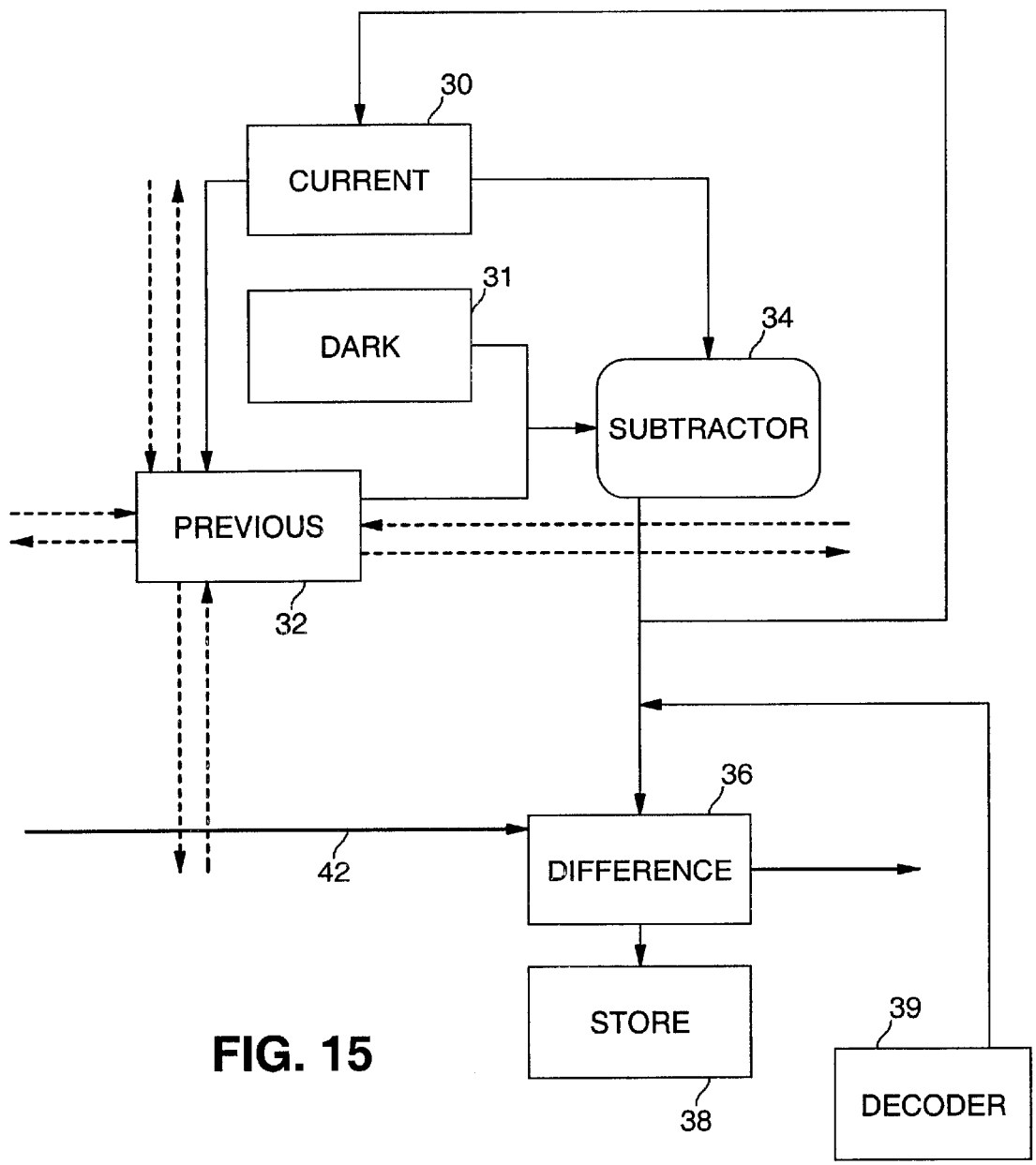
FIG. 15 is a block diagram of the circuitry accompanying each pixel of the image sensor array in an embodiment of the present invention supporting dark noise elimination.

The image sensor array typically has an inherent noise source within each pixel. The "dark current" noise is linear on a pixel-by-pixel basis and can therefore be eliminated from the real image by taking a picture of blackness first, then subtracting the black image from the real image. The additional noise on each pixel is removed by the subtraction operation. The result is a cleaner image. Intrapixel subtractors and registers used for motion estimation can also be used to subtract out the dark current noise. FIG. 15 is a block diagram of the circuitry accompanying each pixel of the image sensor array in an embodiment of the present invention supporting dark current noise elimination. A new register, dark register 31, is added to each pixel's logic. The dark register holds the blackness image value for the pixel. The subtractor 34 subtracts the dark register's value from the current register's value to produce a corrected value. The output of the subtractor feeds back to the current register 30. Thus, in this embodiment, the dark register can be easily used to eliminate dark current noise at each pixel.

While this invention has been described with reference to illustrative embodiments, this description is not intended to be construed in a limiting sense. Various modifications of the illustrative embodiments, as well as other embodiments of the invention, which are apparent to persons skilled in the art to which the inventions pertains are deemed to lie within the spirit and scope of the invention.

What is claimed is:

1. An image sensor array comprising:
   a plurality of pixels, each one of the plurality of pixels comprising
   a first register to store a first pixel value of a first frame;
   a second register to store a second pixel value of a second frame, the second register corresponding to the first register;
   a subtractor coupled to the first and second registers to produce a difference between the first pixel value and the second pixel value; and
   a third register to store the difference between the first and second registers;
   wherein the plurality of pixels are divided into a plurality of N pixel by M pixel blocks, each one of the blocks having N times M differences, each block comprising a fourth register and circuitry for accumulating the N times M differences of each block as a total divergence value into the fourth register.

2. The image sensor array of claim 1, wherein each one of the first registers are coupled with first registers of adjacent pixels to form a two-dimensional network allowing shifting of first pixel values in the left, right, up, and down directions from one first register to another, adjacent first register.

3. The image sensor array of claim 1, wherein the subtractor produces an absolute difference between the first pixel value and the second pixel value.

4. The image sensor array of claim 1, wherein the subtractors of the plurality of pixels operate to produce differences between all pairs of corresponding first and second registers simultaneously in parallel.

5. The image sensor array of claim 1, wherein the circuitry comprises a plurality of accumulators.

6. The image sensor array of claim 1, wherein the first frame is shifted relative to the second frame to create a different correspondence between the first registers and the second registers and wherein each block comprises a register for storing the total divergence value best matching predetermined criteria for the block for all frame shifts.

7. The image sensor array of claim 1, wherein each block comprises motion vector registers for storing motion vector coordinates.

8. The image sensor array of claim 1, wherein the fourth registers are located on edges of the image sensor array.

9. The image sensor array of claim 1, wherein each one of the plurality of pixels comprises a fifth register coupled to the third register to store the difference for the pixel when the fourth register holds the total divergence value matching predetermined criteria for a block.

10. The image sensor array of claim 1, further comprising at least one decoder coupled to the output of the subtractors.

11. The image sensor array of claim 1, wherein each one of the plurality of pixels further comprises a dark register coupled to the subtractor for storing a dark pixel value.

12. The image sensor array of claim 1, wherein each one of the plurality of pixels comprises a photocell.

13. The image sensor array of claim 1, wherein the image sensor array is a CMOS array.

14. A video camera comprising:
   an image sensor array having a plurality of pixels, each one of the plurality of pixels comprising a first register to store a first pixel value of a first frame; a second register to store a second pixel value of a second frame, the second register corresponding to the first register; a subtractor coupled to the first and second registers to produce a difference between the first pixel value and the second pixel value; and a third register to store the difference between the first and second registers; wherein the plurality of pixels are divided into a plurality of N pixel by M pixel blocks, each one of the blocks having N times M differences, each block comprising a fourth register and circuitry for accumulating the N times M differences of each block as a total divergence value into the fourth register.

15. An image sensor array for supporting motion estimation processing comprising:

a plurality of pixels, each one of the plurality of pixels comprising:
first means for storing a first pixel value of a first frame;
second means for storing a second pixel value of a second frame, the second storing means corresponding to the first storing means;
means coupled to the first and second storage means for subtracting the first pixel value from the second pixel value to produce a difference between the first pixel value and the second pixel value; and
third means for storing the difference between the first and second storing means;
wherein the plurality of pixels are divided into a plurality of N pixel by M pixel blocks, each one of the blocks having N times M differences, each block comprising a fourth means for accumulating the N times M differences of each block as a total divergence value.

16. The image sensor array of claim 15, wherein each one of the first storing means are coupled with first storing means of adjacent pixels to form a two-dimensional network allowing shifting of first pixel values in the left, right, up, and down directions from one first storing means to another, adjacent first storing means.

17. The image sensor array of claim 15, wherein the subtracting means of the plurality of pixels operate to produce differences between all pairs of corresponding first and second storing means simultaneously in parallel.

18. The image sensor array of claim 15, wherein each one of the plurality of pixels further comprises a third means for storing the difference between the first and second storing means.

19. The image sensor array of claim 15, wherein each one of the plurality of pixels comprises a fifth storing means coupled to the third storing means for storing the difference for the pixel when the fourth storing means stores the total divergence value matching predetermined criteria for a block.

20. The image sensor array of claim 15, wherein the first frame is shifted relative to the second frame to create a different correspondence between the first storage means and the second storage means and each block comprises means for storing the total divergence value best matching predetermined criteria for the block for all frame shifts.

21. The image sensor array of claim 15, wherein each block comprises means for storing motion vector coordinates.

22. A pixel of an image sensor array, the image sensor array having a plurality of pixels, said pixel comprising:
a first register to store a first pixel value of a first frame;
a second register to store a second pixel value of a second frame, the second register corresponding to the first register;
a subtractor coupled to the first and second registers to produce a difference between the first pixel value and the second pixel value;
a third register to store the difference between the first and second registers; and
a fourth register coupled to the subtractor and the second register to store a dark pixel value.

23. The pixel of claim 22, wherein the subtractor produces an absolute difference between the first pixel value and the second pixel value.

24. The pixel of claim 22, further comprising a fifth register coupled to the third register to store a best difference for the pixel according to predetermined criteria.

25. A method of supporting motion estimation processing in a CMOS image sensor array of a video camera, the CMOS image sensor array having a plurality of pixels wherein the plurality of pixels are divided into a plurality of N pixel by M pixel blocks, comprising:

capturing a first frame and storing pixel values of the first frame in a plurality of first registers, each first register storing a value of one pixel of the CMOS image sensor array within the pixel;

capturing a second frame and storing pixel values of the second frame in a plurality of second registers, each second register storing a value of one pixel of the CMOS image sensor array within the pixel, the second registers corresponding to the first registers;

subtracting the first registers from the second registers in the pixel in parallel to produce a plurality of difference values between the first frame and the second frame;

storing the difference values in third registers, each third register in a pixel for storing the difference in values between the first frame and the second frame for the pixel;

shifting and accumulating the difference values to obtain a total divergence for each block of the CMOS image sensor array; and comparing the total divergence for each block with a previously stored best match for each block.

26. The method of claim 25, further comprising storing a current total divergence for each block as a best match for each block when the current total divergence is better than the previously stored best match according to predetermined criteria.

27. The method of claim 26, further comprising shifting the first frame relative to the second frame.

* * * * *